United States Patent
Chen

(12) 
(10) Patent No.: US 6,541,387 B1
(45) Date of Patent: Apr. 1, 2003

(54) PROCESS FOR IMPLEMENTATION OF A HARDMASK

(75) Inventor: Xiaochun Linda Chen, Hopewell Junction, NY (US)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 10/052,201

(22) Filed: Jan. 17, 2002

(51) Int. Cl.$^7$ ............................................. H01L 21/302
(52) U.S. Cl. ....................................... 438/710; 438/952
(58) Field of Search .................................. 438/710, 752, 438/753, 754, 755, 756, 757, 948, 952

(56) References Cited

U.S. PATENT DOCUMENTS 5,837,405 A * 11/1998 Tomofuji et al.

* cited by examiner

Primary Examiner—John F. Niebling
Assistant Examiner—Stanetta Isaac
(74) Attorney, Agent, or Firm—Lerner, David, Littenberg, Krumholz & Mentlik, LLP

(57) ABSTRACT

A resist layer is deposited atop a substrate and is patterned to expose portions of a substrate. A hardmask layer is deposited atop the patterned resist layer and atop the exposed portions of the substrate. The patterned resist layer is removed so that only a portion of the hardmask layer that is atop the substrate remains.

21 Claims, 3 Drawing Sheets

PROCESS FOR IMPLEMENTATION OF A HARDMASK

BACKGROUND OF THE INVENTION

The invention is directed to the fabrication of semiconductor devices and, more particularly, to the formation of a patterned hardmask layer atop a substrate.

In a known process, a patterned hardmask layer is formed by first depositing a layer of hardmask material atop a substrate. Then, one or more photoresist layers or other resist layers are deposited atop the hardmask layer, and portions of the resist layer are exposed using known methods such as optical, ion beam or electron beam lithography. The resist is then developed to remove either the exposed portions of the resist, when positive resist is used, or the unexposed portions of the resist, when negative resist is used. The remaining portions of the resist serve as a masking layer for a subsequent etching step of the hardmask layer, such as by wet etching, reactive ion etching or other plasma etching processes, so that the pattern of the resist is transferred to the hardmask layer. The hardmask layer may thereafter serve as a masking layer for etching the substrate or for etching other layers disposed between the hardmask and the substrate.

As newer generations of denser and/or faster devices are introduced, smaller feature sizes are required. The lithography tools needed to resolve the smaller feature sizes also typically have smaller depths of focus. As a result, thinner resist layers must be deposited atop the hardmask layer so that the entire thickness of the resist is exposed in all locations of the wafer and avoid unopened regions in the developed resist. The thinner resist layers provide a thinner mask layer for the subsequent etching of the hardmask so that the hardmask layer must be etched under conditions that have greater hardmask-to-resist etching selectivity and which are often more difficult to control. Further, the higher selectivity etching of the hardmask layer is typically carried out at lower plasma energies that are more prone to undercut of the hardmask layer.

Alternatively, a thinner hardmask layer may be deposited atop the substrate to permit less selective etching of the hardmask layer but which provides less masking for subsequent etching steps. The subsequent etching steps must be carried out with higher etching selectivities that are more difficult to control. Further, the deposition of thinner hardmask layer is also often difficult to control.

It is therefore desirable to provide a process of patterning the hardmask layer in a manner that avoids the above problems.

SUMMARY OF THE INVENTION

The present invention provides a process for patterning the hardmask layer. The hardmask layer is deposited after the resist layer is deposited and patterned so that the portions of the hardmask layer that are deposited atop the remaining resist are removed when the resist is removed.

In accordance with the invention, a semiconductor device is fabricated. A resist layer is deposited atop a substrate, and the resist layer is patterned to expose portions of the substrate. A hardmask layer is deposited atop the patterned resist layer and atop the exposed portion of the substrate. The patterned resist layer is removed so that only a portion of the hardmask layer that is atop the substrate remains.

In accordance with another aspect of the invention, a hardmask layer is formed atop a substrate in the manner described above.

The foregoing aspects, features and advantages of the present invention will be further appreciated when considered with reference to the following description of the preferred embodiments and accompanying drawings.

DETAILED DESCRIPTION OF PREFERRED EMBODIMENTS

Figure 1A:
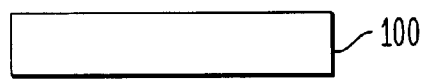
FIGS. 1A–1F illustrate the steps of a known process for forming a patterned hardmask layer.

FIGS. 1A–1F depict a known process for forming patterned a hardmask layer atop a substrate 100. The substrate 100 is shown in FIG. 1A and may be the surface of a wafer or may be a material layer deposited atop the surface of the wafer.

Figure 1B:
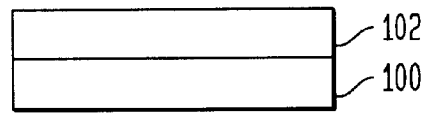
Figure 1C:
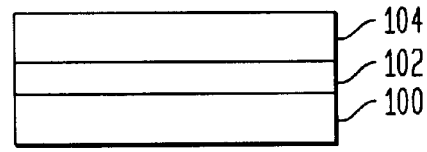
Figure 1D:
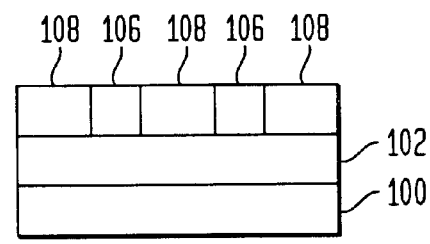
Figure 1E:
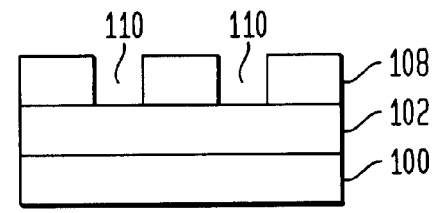
Figure 1F:
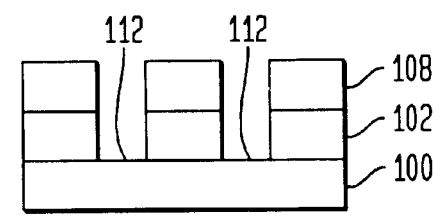

First, a hardmask layer 102 is deposited atop the substrate 100, as FIG. 1B shows, and a resist layer 104 is deposited atop the hardmask layer 102, as shown in FIG. 1C. The resist layer 104 is exposed in a known manner, as FIG. 1D shows, and may also be subject to a post-exposure bake (PEB). The exposed resist 104 is then developed, such as using a known developer solution. The exposed portions 106 of the resist layer are removed when positive resist is used, or the unexposed portions 108 of the resist layer are removed when negative resist is used, so that portions 110 of the hardmask layer 102 are exposed, as FIG. 1E shows. Thereafter, the exposed portions of the hardmask layer 110 are etched by plasma etching, such as by reactive ion etching (RIE), or by a wet etch. The pattern of the resist is thus transferred to the hardmask layer, and portions 112 of the substrate 100 are exposed. The resist may then be removed, and the hardmask may serve as a masking layer for subsequent etching into the substrate.

The known process has the disadvantage that the thickness of the hardmask is restricted by both the resist-to-hardmask etching selectivity as well as by the hardmask-to-substrate etching selectivity of the subsequent substrate etch. Typically, a thinner hardmask layer is preferred for the hardmask etch to avoid removal of the patterned resist layer before the exposed portion of the hardmask is removed which would expose the portion of the hardmask layer that is beneath the resist. By contrast, a thicker hardmask layer is preferred for the subsequent substrate etching to sufficiently mask the etch into the substrate.

Alternatively, a thicker resist layer may be used to mask the hardmask etch but is not suitable for patterning smaller feature sizes. As a further alternative, multi-layer resist schemes may be used but are not easily reworked when the resist layers are improperly exposed.

Another disadvantage of the known process is that the hardmask etching process may be prone to different etch rates at different portions of the wafer so that the resist is entirely removed, as well as some of the underlying hardmask, at one location on the wafer while portions of the exposed hardmask remain at other locations. The hardmask etching may also be prone to undercut beneath the resist layer.

The process of the present invention, shown in FIGS. 2A–2G, avoids the above problems by eliminating the hardmask etch.

Figure 2A:
FIGS. 2A–2G illustrate the steps of a process for forming a patterned hardmask layer in accordance with the invention.
Figure 2B:
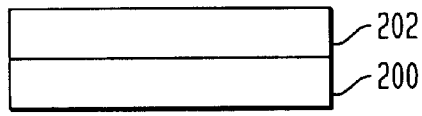
Figure 2C:
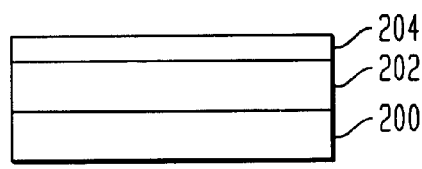
Figure 2D:
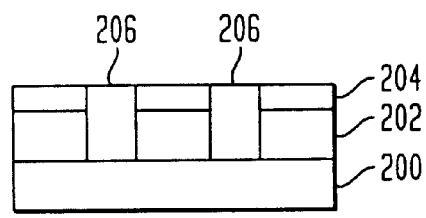

A resist layer 202, shown in FIG. 2B, is deposited atop a substrate 200. The substrate 200, shown in FIG. 2A, may be the surface of a wafer or a layer deposited atop the surface of the wafer, as described above. An anti-reflective coating (ARC) layer 204 is then deposited atop the resist layer 202, as FIG. 2C shows. Portions of the resist layer 202 are then exposed using visible light, ultraviolet light, deep ultraviolet (DUV) light, X-rays and electron beam or an ion beam, as FIG. 2D shows, and may then be subjected to a post exposure bake (PEB). Preferably, a negative resist is used, thereby permitting the same masks to be used as are used in the known process. Alternatively, a positive resist may be used with an inverse mask set that is optimized for exposure of positive resist. As a further alternative, a positive resist is used and exposed with the mask set of the known process, and after exposure, the positive resist is converted into a negative resist by chemical treatment or by cross-linking using thermal processing, electron beam exposure, or other methods.

Figure 2E:
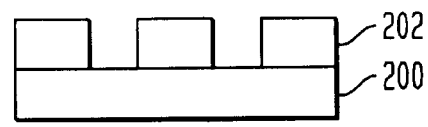

Then, the exposed resist 206 is developed, such as using a wet developer. The exposed portions are removed when the resist is positive resist, as FIG. 2E shows, and the unexposed portions are removed when the resist is negative resist.

Figure 2F:
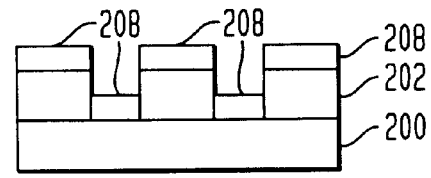
Figure 2G:
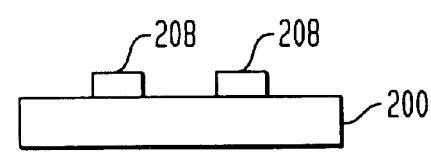

Thereafter, a hardmask layer 208 is deposited atop the patterned resist layer 202 and atop the exposed portions of the substrate 200, as shown in FIG. 2F. The hardmask layer 208 is preferably deposited using a low temperature process, such as by sputtering silicon dioxide ($SiO_2$) or other insulators, germanium (Ge) or other metals, or polycrystalline silicon, by low temperature physical vapor deposition (PVD) or by chemical vapor deposition (CVD). The resist layer 202 is then stripped, such as with a known solvent, which also removes the portion of the hardmask layer 208 that is disposed atop the patterned resist. A remaining portion of the hardmask layer 208 is left atop the substrate in a pattern opposite to that of the patterned resist, as FIG. 2G shows. The hardmask layer may then be used to mask subsequent etching and/or doping steps of the exposed portions of the substrate 200.

Figure 3A:
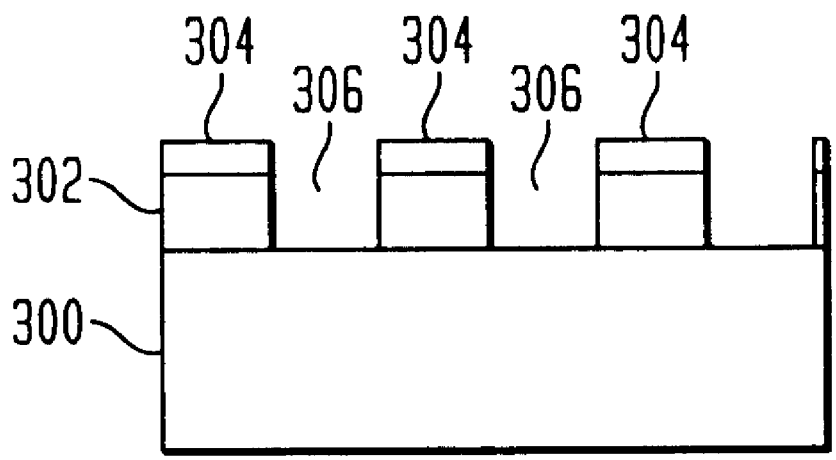
FIGS. 3A–3B illustrate undercutting of the resist layer in accordance with the invention.
Figure 3B:
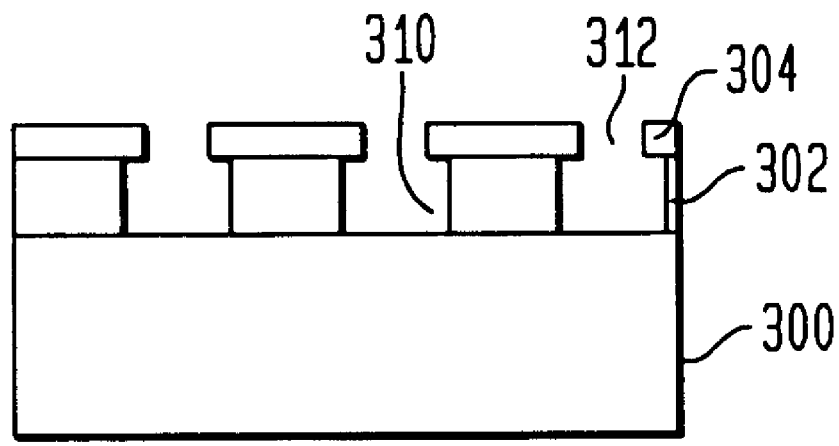

To ensure that all of the hardmask material atop the resist is removed, all of the resist layer must be removed during the resist strip. However, when the openings 306 in the resist layer 302 are of the same width as those in the ARC 304 atop the resist layer, as FIG. 3A shows, hardmask material may be deposited on the sidewalls of the resist openings which prevents removal of the resist during the resist strip. Therefore, the openings 308 in the resist layer 302 preferably undercut the ARC 304, as shown in FIG. 3B, to prevent hardmask materials from forming on the sidewalls. The undercut may be formed by overdeveloping the resist or by treatment with a solvent or plasma after the resist is developed.

Thus, the process of the invention eliminates the etching of the hardmask layer, thereby eliminating the need for the resist to serve as a mask for an etching step. As a result, a thinner resist layer may be used to permit the exposure of smaller feature sizes and to ensure that the complete depth of the resist is exposed.

Further, because the etching of the hardmask layer is eliminated, there is no overetch of the hardmask layer, namely there is no etch of the hardmask layer in regions where all of the resist has been removed. Thus, the thickness of the hardmask layer is determined solely by the deposition process and is better controlled. Moreover, elimination of the hardmask overetch permits the use of thinner hardmask layers.

Additionally, the size of the hardmask features is controlled by the size of the patterns formed in the ARC and in the resist and is controlled more precisely than with a plasma etch step.

Also, an image reverse process such as by combining an alternating phase shift mask (PSM) and negative resist may be used.

Additionally, the thickness of the hardmask layer is limited only by the height of the combined resist and ARC layers, thereby providing greater flexibility in the control of the thickness of the hardmask layer. Further, by eliminating the plasma etch of the hardmask, there is no resist/hardmask interaction during etching which may cause footing or undercut.

Although the invention herein has been described with reference to particular embodiments, it is to be understood that these embodiments are merely illustrative of the principles and applications of the present invention. It is therefore to be understood that numerous modification may be made to the illustrative embodiments and that other arrangements may be devised without departing from the spirit and scope of the present invention as defined by the appended claims.

What is claimed is:

1. A method of fabricating a semiconductor device, said method comprising:

depositing a resist layer atop a substrate;

patterning said resist layer to expose portions of said substrate;

depositing a hardmask layer atop said patterned resist layer and said exposed portions of said substrate; and removing said patterned resist layer so that only a portion of said hardmask layer that is atop said substrate remains.

2. The method of claim 1 wherein said step of depositing a resist layer includes depositing an anti-reflective coating (ARC) atop said resist layer.

3. The method of claim 1 wherein said step of patterning said resist layer includes exposing said resist layer to at least one of visible light, ultraviolet light, deep-ultraviolet light, X-rays, an electron beam, and an ion beam.

4. The method of claim 3 wherein said patterning step includes a post-exposure bake of said resist.

5. The method of claim 3 wherein said patterning step includes developing said resist after said exposure step.

6. The method of claim 3 wherein said patterning step includes treating said resist such that said resist undercuts an anti-reflective coating deposited atop said resist prior to said exposure step.

7. The method of claim 3 wherein said patterning step includes, after said exposure step, at least one of thermal processing said resist and exposing said resist to an electron beam, to cross-link said resist.

8. The method of claim 1 wherein said step of depositing said hard mask layer includes at least one of sputtering, low temperature physical vapor deposition (PVD), and chemical vapor deposition (CVD).

9. A method of forming a patterned hardmask layer atop a substrate, said method comprising:

patterning said resist layer to expose portions of said substrate;

depositing a hardmask layer atop said patterned resist layer and atop said exposed portions of said substrate; and removing said patterned resist layer so that only a portion of said hardmask layer that is atop said substrate remains.

10. The method of claim 9 wherein said step of depositing a resist layer includes depositing an anti-reflective coating (ARC) atop said resist layer.

11. The method of claim 9 wherein said step of patterning said resist layer includes exposing said resist layer to at least one of visible light, ultraviolet light, deep-ultraviolet light, X-rays, an electron beam, and an ion beam.

12. The method of claim 11 wherein said patterning step includes a post-exposure bake of said resist.

13. The method of claim 11 wherein said patterning step includes developing said resist after said exposure step.

14. The method of claim 11 wherein said patterning step includes treating said resist such that said resist undercuts an anti-reflective coating deposited atop said resist prior to said exposure step.

15. The method of claim 11 wherein said patterning step includes, after said exposure step, at least one of thermal processing said resist and exposing said resist to an electron beam to cross-link said resist.

16. The method of claim 9 wherein said step of depositing said hard mask layer includes at least one of sputtering, low temperature physical vapor deposition (PVD), and chemical vapor deposition (CVD).

17. A method of fabricating a semiconductor device, said method comprising:

depositing a resist layer atop a substrate;

depositing an anti-reflective coating (ARC) atop said resist layer;

exposing said resist layer to at least one of visible light, ultraviolet light, deep ultraviolet light, X-rays, an electron beam and an ion beam;

developing said resist to expose portions of said substrate;

depositing a hardmask layer atop said patterned resist layer and atop said exposed portion of said substrate using at least one of sputtering, low temperature physical vapor deposition (PVD), and chemical vapor deposition (CVD); and removing said patterned resist layer such that only a portion of said hardmask layer that is atop said substrate remains.

18. The method of claim 1 wherein said step of removing said patterned resist layer includes stripping said patterned resist layer thereby removing a further portion of said hardmask layer that is atop said patterned resist layer.

19. The method of claim 9 wherein said step of removing said patterned resist layer includes stripping said patterned resist layer thereby removing a further portion of said hardmask layer that is atop said patterned resist layer.

20. The method of claim 17 wherein said step of exposing said resist layer includes exposing said anti-reflective coding atop said resist layer.

21. The method of claim 17 wherein said step of removing said patterned resist layer includes stripping said patterned resist layer thereby removing a further portion of said hardmask layer that is atop said patterned resist layer.

* * * * *